(12) United States Patent
Lee

(10) Patent No.: US 8,542,269 B2
(45) Date of Patent: Sep. 24, 2013

(54) CHARGE COUPLED DEVICE FOR OBTAINING A 3-DIMENSIONAL DIGITAL IMAGE

(75) Inventor: Chung Nam Lee, Busan (KR)

(73) Assignee: Geo Sung Enterprise Co., Ltd.

( * ) Notice: Subject to any disclaimer, the term of this patent is extended or adjusted under 35 U.S.C. 154(b) by 744 days.

(21) Appl. No.: 12/376,619

(22) PCT Filed: Mar. 27, 2007

(86) PCT No.: PCT/KR2007/001485
§ 371 (c)(1), (2), (4) Date: Apr. 13, 2010

(87) PCT Pub. No.: WO2008/018675
PCT Pub. Date: Feb. 14, 2008

(65) Prior Publication Data
US 2010/0188487 A1    Jul. 29, 2010

(30) Foreign Application Priority Data

Aug. 8, 2006   (KR) ...................... 10-2006-0074485
Aug. 30, 2006  (KR) ...................... 10-2006-0082948

(51) Int. Cl.
*H04N 15/00*   (2006.01)
(52) U.S. Cl.
USPC .......... 348/49; 348/42; 348/46; 348/E13.002; 348/E13.007

(58) Field of Classification Search
None
See application file for complete search history.

(56) References Cited

U.S. PATENT DOCUMENTS

| | | | |
|---|---|---|---|
| 5,548,362 A | 8/1996 | Wah Lo et al. | |
| 6,130,957 A * | 10/2000 | Horikoshi et al. | 348/40 |
| 6,172,373 B1 * | 1/2001 | Hara et al. | 355/53 |
| 6,580,557 B2 | 6/2003 | Huang | |
| 6,795,241 B1 | 9/2004 | Holzbach | |
| 6,950,121 B2 | 9/2005 | Tserkovnyuk | |
| 2003/0063185 A1 * | 4/2003 | Bell | 348/46 |
| 2003/0234980 A1 * | 12/2003 | Montgomery et al. | 359/462 |

* cited by examiner

*Primary Examiner* — Thomas Dailey
*Assistant Examiner* — Nam Tran
(74) *Attorney, Agent, or Firm* — Park & Associates IP Law, P.C.

(57) ABSTRACT

The present invention relates to a charge coupled device, which is improved to obtain a distinct and clear 3-dimensional image without requiring separate equipment. The charge coupled device for obtaining a 3-dimensional image according to the present invention includes a main body (101), having an open top and a cavity formed therein, and having a chip pin formed on an outer surface thereof to transfer information to an electronic element of a digital image recording device. A light receiving element (102) is mounted on a bottom surface of interior of the main body and consists of a set of a plurality of optical sensors, which are sensitive to light. A slit plate (110) is configured to cover an opening of the cavity of the main body, and is formed such that transparent parts and opaque parts are arranged to alternate.

7 Claims, 4 Drawing Sheets

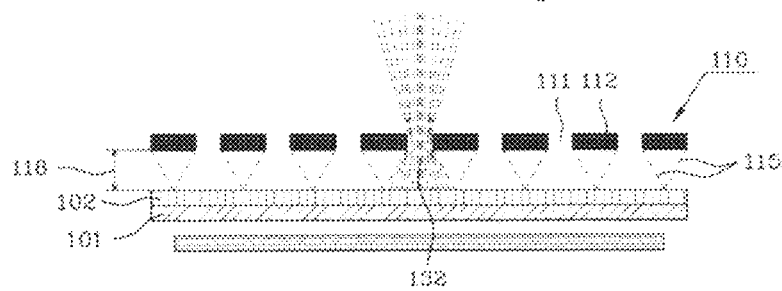

CHARGE COUPLED DEVICE FOR OBTAINING A 3-DIMENSIONAL DIGITAL IMAGE

TECHNICAL FIELD

The present invention relates, in general, to a charge coupled device for digital image recording devices and, more particularly, to a charge coupled device, which is installed in various types of digital image recording devices, such as digital cameras, digital camcorders, and digital medical imaging devices, and enables particularly distinct and clear 3-dimensional images to be obtained.

BACKGROUND ART

Human eyes are horizontally separated by a distance of about 65 mm, and the binocular disparity caused by this horizontal separation is the most important factor in 3-dimensional perception. That is, the left and right eyes see different two-dimensional images. When the images are transmitted to the brain through the retinas, the brain precisely combines the images with each other, thus realizing the depth and reality of an original 3-dimensional image.

Up to date, there have been attempts to realize 3-dimensional shapes through various types of devices such as optical instruments, and some technologies have reached commercialization. For example, a polarizing filter method is technology for separating images acquired with the left and right eyes using a shielding effect obtained by the combination of orthogonal polarizing devices, and is implemented such that the left and right images are protected on a screen through a video projector equipped with orthogonal polarizing filters or the like, and are observed using glasses equipped with orthogonal polarizing filters or the like. In addition to the polarizing filter method, there is a time division stereoscopic representation method of alternately and sequentially switching left and right images, having a parallax difference therebetween, presenting the left and right images to both eyes, and representing the left and right images as a 3-dimensional image using shutter glasses switched in synchronization with the switching operation of left and right images. Moreover, there are glasses-free methods requiring no special glasses, such as a parallax barrier method, a lenticular method, and a holography method. The parallax barrier method is implemented such that images corresponding to left and right eyes are alternately arranged behind a thin slit-shaped opening called a parallax barrier and are spaced apart from the parallax barrier by a suitable distance, so that they can thus be precisely separated and viewed as a 3-dimensional image when the left and right images are viewed through the opening at a specific time point. The lenticular method is implemented such that left and right images are arranged on the focal surface of a semi-cylindrical lens, called a lenticular screen, in stripes, are separated depending on the directivity of a lenticular lens plate, and are thus represented as a 3-dimensional image without requiring glasses when the images are observed through the lenticular lens plate. In addition to the above-described methods, many attempts to satisfactorily obtain a 3-dimensional image have been made to date. However, these conventional methods are problematic in that special devices, such as polarizing glasses or a lenticular lens, are required, or in that the construction of a device for obtaining a 3-dimensional image is very complicated. Accordingly, the conventional methods are problematic in that, since the costs of manufacturing the device are very high, general consumers cannot easily access such methods.

Korean Patent No. 423124, entitled "Three-Dimensional Image System" and filed by the present applicant with the Office of Patent Administration on Jun. 20, 2001, is intended to obtain such a 3-dimensional image more simply and excellently. That is, the patent, incorporated with the present invention, discloses an optical recording device in which a film or the like, which is an image recording medium, is placed at a location far beyond a Fresnel region, which is a region in which light travels straight when passing through slits, thus realizing a clear 3-dimensional image without being influenced by an afterimage attributable to diffraction at the slits. FIG. 1 is a schematic diagram showing the construction of an optical device for recording a 3-dimensional image using slits, and FIG. 2 is a conceptual view showing the image formation of a 3-dimensional image recording device using a slit plate proposed by the present applicant. Unlike conventional optical devices using slits, in which 3-dimensional image information is recorded on a film, which is an image recording medium, within the range of a Fresnel region in which light, passed through slits, travels straight, the above patent is configured such that 3-dimensional image information is recorded on a film 203, which is an image recording medium, with the film 203 being located a sufficient distance from a slit plate to be far beyond the Fresnel region, thus preventing an unnecessary afterimage, attributable to the characteristics of a slit plate 204, from being recorded. That is, the optimal image formation distance between the slit plate 204 and the film 203 is determined according to the ratio of the widths of the transparent parts and the opaque parts of the slit plate. In FIG. 2, "a" denotes the length of the Fresnel region, which is the region in which light, passed through slits, travels straight, and "b" denotes an optimal image formation distance requiring that an image is formed at a location beyond the Fresnel region. Reference numeral 201, which is not described, denotes the main body of the image recording device, and reference numeral 202 denotes a lens. technology applicable to analog optical instruments, such as analog cameras or camcorders, but, recently, digital image recording devices have prevailed.

FIG. 3 is a longitudinal sectional view of a conventional Charge Coupled Device (CCD). A CCD 300 includes a main body 301, having an open top and a cavity formed therein, and having a plurality of chip pins 303 formed on the outer surface thereof, a light receiving element 302 composed of a plurality of pixels and mounted on the bottom surface of the interior of the main body, and a transparent glass plate 304 for covering the opening of the cavity of the main body 301. Such a CCD is adapted to accumulate charges corresponding to image information of light in the light receiving element, which sensitively reacts to the brightness of image light passed through a lens, and to record and store the charges in an external memory device or the like. Most digital image recording devices have recently adopted the CCD. However, it is impossible to obtain a 3-dimensional image using only the conventional CCD 300 itself, and it is only possible to record the brightness of light, passed through the lens, and thus the support of a separate device or separate software to the obtainment of a 3-dimensional image is required.

DISCLOSURE OF INVENTION

Technical Problem

Accordingly, the present invention has been made keeping in mind the above problems occurring in the prior art, and an object of the present invention is to provide a charge coupled device, which is installed in various types of digital image recording devices, such as digital cameras or digital camcorders, and can thus be improved to directly obtain a 3-dimensional image without requiring a separate means.

In detail, an object of the present invention is to provide a charge coupled device for digital image recording devices, which can directly record information about a 3-dimensional image, obtained from light passed through a lens, on a light receiving element placed in the charge coupled device, without requiring separate polarizing glasses, a separate lenticular lens or other additional devices, and can store the recorded information in memory or the like.

Technical Solution

In order to accomplish the above object, the present invention proposes a Charge Coupled Device (CCD) having the following technical characteristics.

The present invention provides a charge coupled device for obtaining a three-dimensional image, the charge coupled device being installed in a digital image recording device to output an image of a subject, comprising a main body, having an open top and a cavity formed therein, and having a chip pin formed on an outer surface thereof to transfer information to an electronic element of the digital image recording device, a light receiving element mounted on a bottom surface of interior of the main body and comprising a set of a plurality of optical sensors, which are sensitive to light, and a slit plate configured to cover an opening of the cavity of the main body, and formed such that transparent parts and opaque parts, widths of which have a uniform ratio, are arranged to alternate, wherein a distance between the slit plate and the light receiving element is optimized so that image information can be recorded on the light receiving element at a location beyond a Fresnel region, in which light travels straight when light passed through a lens passes through the transparent parts of the slit plate.

Preferably, the distance between the slit plate and the light receiving element may be optimized so that intersections of diffracted light, passed through neighboring transparent parts of the slit plate, are located on an image recording surface of the light receiving element.

Preferably, the charge coupled device may further comprise a separate color filter provided on a top of the slit plate, or the slit plate may be formed to be integrated with the color filter.

Preferably, the transparent parts and the opaque parts may have a ratio of widths thereof that falls within a range of 1:3 to 1:6, or a range of 3:1 to 6:1.

Preferably, the transparent parts and the opaque parts of the slit plate may define slits, each having a shape corresponding to any one selected from a diagonal shape and a concentric circular shape.

Advantageous Effects

According to the CCD of the present invention, there is an advantage in that 3-dimensional image information is recorded on a light receiving element, which is an optical recording medium located a sufficient distance from a slit plate to be beyond a Fresnel region, using the slit plate, in which multiple slits, defined by transparent parts and opaque parts, are alternately arranged, thus enabling a high-quality 3-dimensional image, which is clear and has no afterimage, to be obtained.

Further, the present invention is advantageous in that a slit plate, in which transparent parts and opaque parts, the widths of which have a uniform ratio, are arranged to alternate, can be integrated with a color filter, so that the construction of a CCD is further simplified, thus realizing the compactness of a manufacturing process and economic effects, such as the reduction of manufacturing costs.

As described above, according to the CCD of the present invention, a clear 3-dimensional image having reliable quality can be obtained without requiring a separate complicated device.

BRIEF DESCRIPTION OF THE DRAWINGS

FIGS. 9 to 11 are views schematically showing the travel path of light to describe the differences between images corresponding to image formation distances.

BEST MODE FOR CARRYING OUT THE INVENTION

Figure 1:
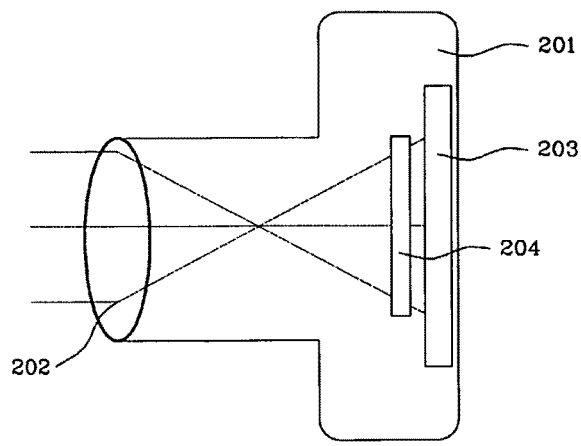
FIG. 1 is a schematic diagram showing the construction of an optical device for recording a 3-dimensional image using slits.
Figure 2:
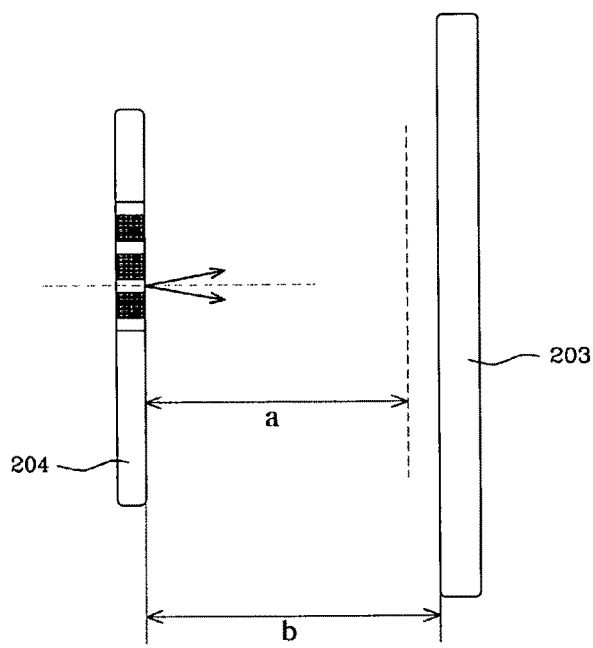
FIG. 2 is a conceptual view showing the image formation of a 3-dimensional image recording device using a slit plate proposed by the present applicant.
Figure 3:
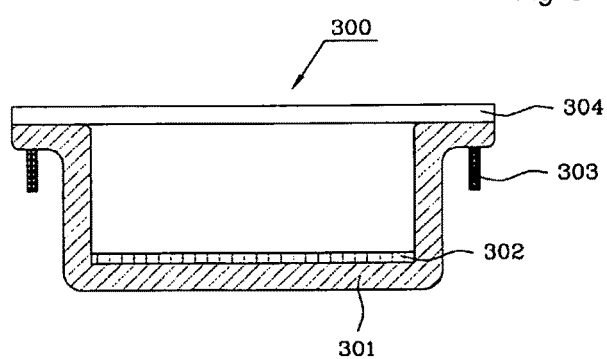
FIG. 3 is a longitudinal sectional view of a conventional charge coupled device.
Figure 4:
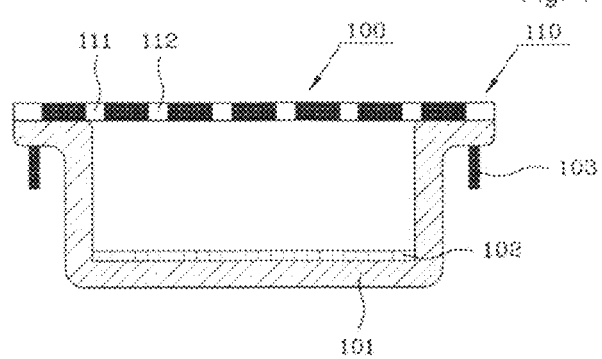
FIG. 4 is a longitudinal sectional view of a charge coupled device according to an embodiment of the present invention.
Figure 5:
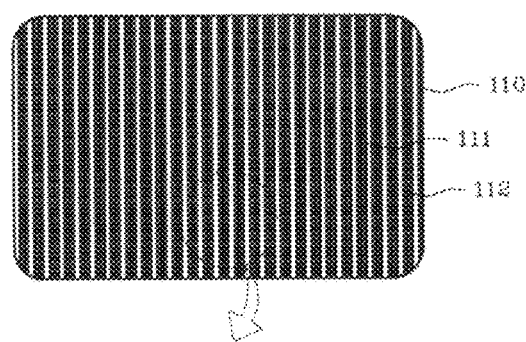
FIG. 5 illustrates a plan view and a partially enlarged view of a slit plate installed in the charge coupled device of FIG. 4.

FIG. 4 is a longitudinal sectional view of a charge coupled device according to an embodiment of the present invention, and FIG. 5 illustrates a plan view and a partially enlarged view of a slit plate installed in the charge coupled device of FIG. 4.

Typical 3-dimensional imaging technology using slits is implemented such that image information is recorded on an image recording medium when light, passed through the slits, falls within a range of a Fresnel region, that is, a region in which light travels straight. Therefore, according to this conventional technology, unfavorable effects surely occur due to the slits, and unnecessary patterns caused by the characteristics of the slits appear on the recorded image.

A Charge Coupled Device (CCD) 100 according to the present invention includes a main body 101, having an open top and a cavity formed therein and having chip pins 103 formed on portions of the outer surface thereof to transfer information to the electronic elements of an image recording device, a light receiving element 102 mounted on the bottom surface of the interior of the main body 101 and configured to record the image information of transmitted light in the form of an electrical signal, and a slit plate 110 configured to cover the opening of the cavity of the main body 101 and formed such that multiple slits, defined by transparent parts 111 and opaque parts 112, are arranged to alternate.

The image of a subject is formed on the light receiving element 102 of the CCD 100, which is an imaging device, through a lens (not shown), and is accumulated in the light receiving element 102 as charges. The charges accumulated in the light receiving element 102 are processed by a preprocessor (not shown) or the like in a predetermined manner, and the processed charges are stored in a storage device such as memory in the format of digital information through an Analog/Digital (A/D) converter or the like. The digital image information stored in the memory is subsequently displayed as an image on a display device, such as a Liquid Crystal Display (LCD).

The light receiving element 102 is a set of a plurality of optical sensors or pixels made of silicon, which is sensitive to light. When the distance between the slit plate 110 and the image recording surface on the top of the light receiving element 102 is defined as an image formation distance so that a 3-dimensional image can be recorded, the image formation distance of the present invention extends beyond the Fresnel region, which is the region in which light, passing through the transparent parts of the slit plate 110, travels straight. That is, the light receiving element 102 is located a sufficient distance from the slit plate to be beyond the Fresnel region. When light, reflected from the subject and passed through a lens (not shown), passes through the transparent parts 111 of the slit plate 110, light travels straight in the Fresnel region without being diffracted. If the light deviates from the Fresnel region, it is diffracted, and thus diffracted light is formed. The light, passed through the slits corresponding to the transparent parts 111, forms patterns attributable to the characteristics of the slits on the light receiving element 102, as described above. However, when the image formation distance is gradually increased from zero, the image recorded on the light receiving element is gradually influenced less and less by the patterns of the slits as the light passes through the Fresnel region.

In this embodiment, as shown in FIG. 5, a slit plate 110, in which multiple vertical transparent parts 111 and opaque parts 112 are arranged to alternate, is used. Each of the transparent parts 111 and the opaque parts 112 may be preferably formed to have a width of several micrometers, and the ratio of the width of the transparent parts to the width of the opaque parts may fall within a range from 1:3 to 1:6, or from 3:1 to 6:1. The slit plate 110 may be formed to have a thickness of about 50 □ to 0.5 □. The optimal image formation distance that can be obtained by the slit plate 110 of the present invention varies with the magnitudes of respective widths of the transparent parts 111 and the opaque parts 112, or the ratio of the widths thereof. For example, when the width of each transparent part 111 is 30 □, and the width of each opaque part 112 is 180 □, the image formation distance of the present invention is 11 to 12 □. In the present invention, it should be noted that the transparent parts 111 are not formed by making openings in the slit plate 110. That is, the slit plate 110 of the present invention is made of material that can be used for an optical lens or an optical filter, and the transparent parts 111 are formed to be transparent so as to allow light to pass therethrough, unlike the opaque parts 112.

Figure 8:
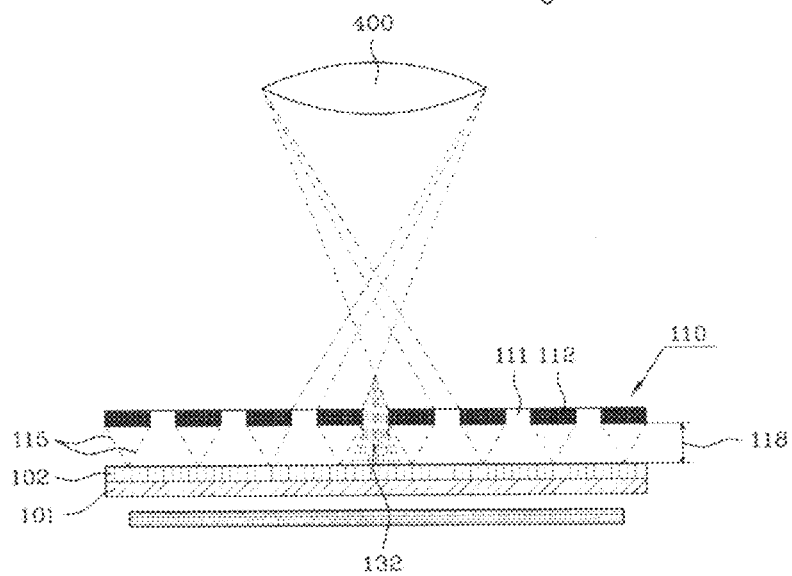
FIG. 8 is a view schematically showing a process in which light, passed through a lens, passes through slits corresponding to transparent parts, so that image information is recorded on a light receiving element.

FIG. 8 is a view schematically showing a process in which light, passed through a lens, passes through the slits corresponding to the transparent parts 111 and image information is recorded on the light receiving element 102. The light receiving element 102 placed in the CCD 100 of the present invention is located a sufficient distance from the slit plate 110 to be beyond the Fresnel region. As shown in the drawing, light passing through the transparent parts 111 via a lens 400 travels straight in a Fresnel region 132, and light passing through the opposite edges of each transparent part 111 is diffracted to thus form diffracted light 115. Reference numeral 118 denotes the image formation distance of the present invention, which extends beyond the Fresnel region.

Figure 9:
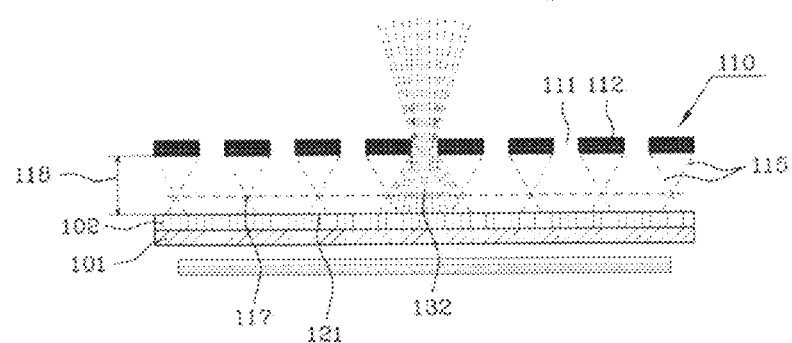
Figure 10:
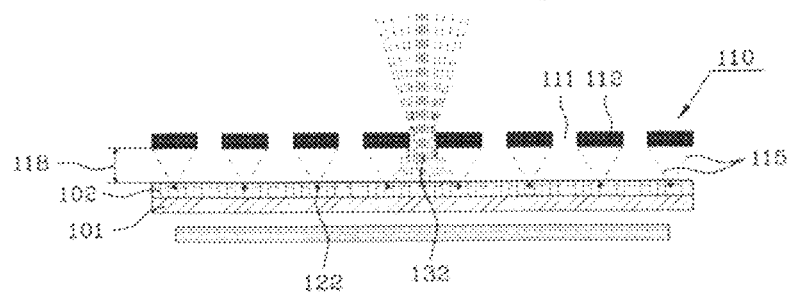

FIGS. 9 to 11 are views schematically showing the travel path of light to describe the differences between images corresponding to image formation distances.

FIG. 9 illustrates the case where the distance between the slit plate 110 and the light receiving element 102 of the CCD 100 is excessively long, and thus the influence of a diffraction pattern, formed when light passes through the transparent parts 111, is produced, and FIG. 10 illustrates the case where the distance between the slit plate 110 and the light receiving element 102 is excessively short, and thus the influence of a diffraction pattern, formed when light passes through the transparent parts 111, is produced. The image formation distance 118 of the present invention, that is, the distance between the slit plate 110 and the light receiving element 102, is longer than the length of the Fresnel region, as noted above. However, when the distance is excessively long, image formation is influenced by the diffracted light 115 of the light passed through neighboring transparent parts 111. In this case, intersections 117 of the diffracted light 115 are disposed between the slit plate 110 and an image recording surface, which is the top surface of the light receiving element 102. At this time, when 3-dimensional image information is converted into charges and the charges are accumulated in the light receiving element 102, stripe patterns, represented by white lines 121, are generated on an output 3-dimensional image due to the unfavorable effects of the diffracted light 115.

In contrast, when the image formation distance 118 is excessively short, intersections 117 of diffracted light 115 are disposed below the image recording surface of the light receiving element 102, as shown in FIG. 10, and stripe patterns, represented by black lines 122, are generated on an output 3-dimensional image. Such white or black stripe patterns ultimately result in the deterioration of the output 3-dimensional image.

Therefore, when the image recording surface of the light receiving element 102 is allowed to be placed on locations which are coincident with the intersections 117 of the diffracted light 115 passed through neighboring transparent parts 111, a distinct and clear 3-dimensional image can be obtained, without being influenced by interference patterns attributable to the diffracted light 115.

Here, the distance between the slit plate 110 and the image recording surface of the light receiving element 102, obtained when the intersections 117 of the diffracted light 115 are located on the image recording surface of the light receiving element 102, is defined as an optimal image formation distance. The optimal image formation distance varies with the magnitudes of respective widths of the transparent parts 111 and the opaque parts 112, or the ratio of the widths thereof.

A separate color filter (not shown) is preferably provided on the top of the slit plate 110 to be spaced apart from, or to come into close contact with, the slit plate 110. Further, the color filter may be integrated with the slit plate 110. In this case, since there is no need to mount a separate color filter, there are advantages in that the process of manufacturing the CCD can be simplified, and the components of the CCD can be freely designed.

Mode for the Invention

Figure 6:
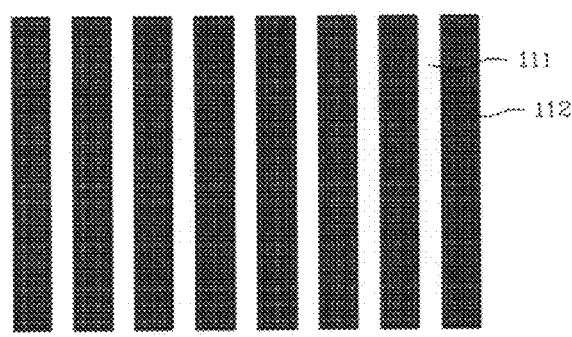
FIG. 6 is a plan view of a slit plate according to a second embodiment of the present invention.
Figure 6:
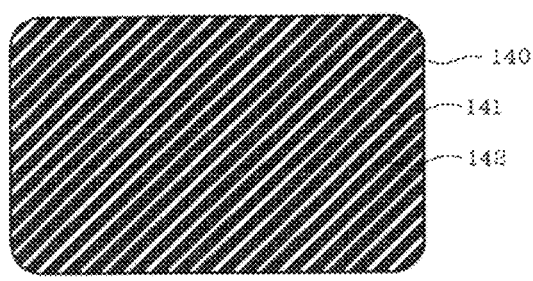

FIG. 6 illustrates a slit plate 140 according to another embodiment of the present invention. In the slit plate 140 according to this embodiment, transparent parts 141 and opaque parts 142 are arranged to alternate and are diagonally inclined. When the slit plate 140, in which the diagonally inclined slits are formed, is used, directionality attributable to slits can be reduced.

Figure 7:
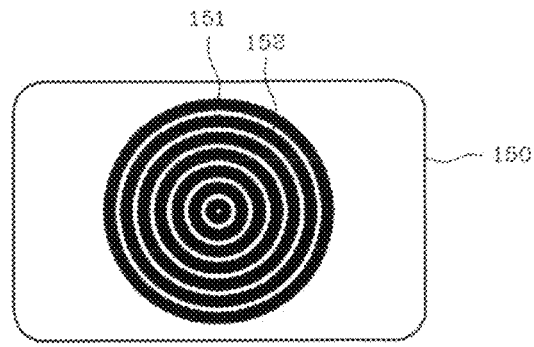
FIG. 7 is a plan view of a slit plate according to a third embodiment of the present invention.

FIG. 7 illustrates a slit plate 150 according to a further embodiment of the present invention. In the slit plate 150 according to this embodiment, transparent parts 151 and opaque parts 152 are alternately arranged while forming concentric circles. When the slit plate 150 having this shape is employed, the control of the directionality of slits can be further facilitated.

Industrial Applicability

As described above, the present invention provides a charged coupled device, which can be installed in most digital image recording devices, such as digital cameras, digital camcorders and digital medical imaging devices. Accordingly, it can be considered that the utilization of the charge coupled device of the present invention, which is to obtain a 3-dimensional image, is high in all industrial fields.

Moreover, since a digital image recording device that adopts the charge coupled device of the present invention does not need separate equipment to obtain a 3-dimensional image, the digital image recording device can be expected to be widely applied to actual various imaging device fields.

The invention claimed is:

1. A charge coupled device for obtaining a three-dimensional image, the charge coupled device being installed in a digital image recording device to output an image of a subject, comprising:
   a main body, having an open top and a cavity formed therein, and having a chip pin formed on an outer surface thereof to transfer information to an electronic element of the digital image recording device;
   a light receiving element mounted on a bottom surface in an interior area of the main body and comprising a set of a plurality of optical sensors, which are sensitive to light; and
   a slit plate placed to cover an opening of the cavity of the main body, the slit plate having transparent parts and opaque parts arranged alternately in a pattern, and with widths of the transparent parts and the opaque parts in a uniform ratio,
   wherein a distance between the slit plate and the light receiving element is optimized such that an image information of the subject is recorded on the light receiving element at a location beyond a Fresnel region, in which light travels straight when light passed through a lens passes through the transparent parts of the slit plate, to obtain the image information of the subject with a three-dimensional information coupled thereto.

2. The charge coupled device according to claim 1, wherein the distance between the slit plate and the light receiving element is optimized so that intersections of diffracted light, passed through neighboring transparent parts of the slit plate, are located on an image recording surface of the light receiving element.

3. The charge coupled device according to claim 1, further comprising a separate color filter provided on a top of the slit plate.

4. The charge coupled device according to claim 1, wherein the slit plate is formed to be integrated with a color filter.

5. The charge coupled device according to claim 1, wherein the transparent parts and the opaque parts have said ratio of widths in a range of 1:3 to 1:6.

6. The charge coupled device according to claim 1, wherein the transparent parts and the opaque parts have said ratio of widths in a range of 3:1 to 6:1.

7. The charge coupled device according to any one of claims 1 to 5, wherein the pattern defined by the transparent parts and the opaque parts of the slit plate has a pattern selected from a parallel-arranged slit pattern, a diagonally arranged slit pattern, and a concentric circular slit pattern.

* * * * *